(12) United States Patent
Xie et al.

(10) Patent No.: US 11,942,374 B2
(45) Date of Patent: Mar. 26, 2024

(54) NANOSHEET FIELD EFFECT TRANSISTOR WITH A SOURCE DRAIN EPITAXY REPLACEMENT

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Chanro Park, Clifton Park, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 17/304,250

(22) Filed: Jun. 17, 2021

(65) Prior Publication Data

US 2022/0406664 A1 Dec. 22, 2022

(51) Int. Cl.
| | |
|---|---|
| *H01L 21/8238* | (2006.01) |
| *H01L 21/02* | (2006.01) |
| *H01L 27/092* | (2006.01) |
| *H01L 29/06* | (2006.01) |
| *H01L 29/417* | (2006.01) |

(Continued)

(52) U.S. Cl.
CPC ......... *H01L 21/823814* (2013.01); *H01L 21/02532* (2013.01); *H01L 21/02576* (2013.01); *H01L 21/02579* (2013.01); *H01L 21/0259* (2013.01); *H01L 21/823807* (2013.01); *H01L 21/823871* (2013.01); *H01L 27/092* (2013.01); *H01L 29/0665* (2013.01); *H01L 29/41733* (2013.01); *H01L 29/42392* (2013.01); *H01L 29/7845* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| | | |
|---|---|---|
| 9,627,497 B1 | 4/2017 | Seo |
| 9,947,804 B1 | 4/2018 | Frougier |

(Continued)

OTHER PUBLICATIONS

Disclosed Anonymously, "Introduction of Dual Channel Strain in nanosheet CMOS", IPCOM000256176D, IP.com Electronic Publication Date: Nov. 8, 2018, 6 pages.

*Primary Examiner* — Evren Seven
*Assistant Examiner* — Cole Leon Lindsey
(74) *Attorney, Agent, or Firm* — Yuanmin Cai

(57) ABSTRACT

A semiconductor structure may include a first nanosheet field-effect transistor formed on a first portion of a substrate, a second nanosheet field-effect transistor formed on a second portion of the substrate, and one or more metal contacts. The first field-effect transistor formed on the first portion of a substrate may include a first source drain epitaxy. A top surface of the first source drain epitaxy may be above a top surface of a top-most nanosheet channel layer. The second nanosheet field-effect transistor formed on the second portion of the substrate may include a second source drain epitaxy and a third source drain epitaxy. The second source drain epitaxy may be below the third source drain epitaxy. The third source drain epitaxy may be u-shaped and may be connected to at least one nanosheet channel layer.

14 Claims, 13 Drawing Sheets

(51) Int. Cl.
*H01L 29/423* (2006.01)
*H01L 29/78* (2006.01)
*H01L 29/786* (2006.01)

(56) References Cited

U.S. PATENT DOCUMENTS

| | | |
|---|---|---|
| 10,366,931 B2 | 7/2019 | Xie |
| 10,381,273 B1 | 8/2019 | Cheng |
| 10,714,398 B2 | 7/2020 | Zhu |
| 10,741,558 B2 | 8/2020 | Chiang |
| 2017/0062428 A1* | 3/2017 | Cheng ............. H01L 21/823807 |
| 2018/0006141 A1 | 1/2018 | Fronheiser |
| 2019/0273027 A1 | 9/2019 | Basker |
| 2020/0266271 A1* | 8/2020 | Lin .................. H01L 21/02603 |
| 2022/0209013 A1* | 6/2022 | Kim ................. H01L 29/78696 |

* cited by examiner

NANOSHEET FIELD EFFECT TRANSISTOR WITH A SOURCE DRAIN EPITAXY REPLACEMENT

BACKGROUND

The present invention relates to a semiconductor structure and a method of forming the same. More particularly, the present invention relates to a semiconductor structure that includes a nanosheet field effect transistor (FET) with a source drain epitaxy replacement.

Integrated circuit (IC) designs are often driven by device performance, scalability, and manufacturability. For example, nanosheet FETs were developed to improve device drive current and electrostatics and to allow for device size scaling. A typical body of a nanosheet FET may include multiple nanosheet channel layers arranged as a layered stack. Initially, the nanosheet channel layers may be arranged in a layer stack with sacrificial layers containing a material (e.g., silicon-germanium) that can be etched selectively to the material (e.g., silicon) constituting the nanosheet channel layers. The sacrificial layers are etched and removed in order to release the nanosheet channel layers and to provide spaces for the formation of a gate stack.

SUMMARY

According to one embodiment of the present invention, a semiconductor structure is provided. The semiconductor structure may include a first nanosheet field-effect transistor formed on a first portion of a substrate, a second nanosheet field-effect transistor formed on a second portion of the substrate, and one or more metal contacts. The first field-effect transistor formed on the first portion of a substrate may include a first source drain epitaxy. A top surface of the first source drain epitaxy may be above a top surface of a top-most nanosheet channel layer. The second nanosheet field-effect transistor formed on the second portion of the substrate may include a second source drain epitaxy and a third source drain epitaxy. The second source drain epitaxy may be below the third source drain epitaxy. The third source drain epitaxy may be u-shaped and may be connected to at least one nanosheet channel layer. At least one of the one or more metal contacts may extend vertically from a top surface of an interlayer dielectric to the at least one nanosheet channel layer. At least one of the one or more metal contacts may transfer compressive stress on to the at least one nanosheet channel layer. The semiconductor structure may include an isolation layer separating the substrate from the first source drain epitaxy and the second source drain epitaxy, and a shallow trench isolation separating the first nanosheet field-effect transistor formed on the first portion of a substrate from the second nanosheet field-effect transistor formed on the second portion of a substrate. The first source drain epitaxy may be made of phosphorous doped silicon. The second source drain epitaxy may be made of boron doped silicon. The third source drain epitaxy may be made of pure germanium or silicon germanium doped with a high germanium percentage. The first nanosheet field-effect transistor or the second nanosheet field-effect transistor may be a p-type nanosheet field-effect transistors. The first nanosheet field-effect transistor or the second nanosheet field-effect transistor may be a n-type nanosheet field-effect transistors.

According to another embodiment of the present invention, a semiconductor structure is provided. The semiconductor structure may include a first nanosheet field-effect transistor formed on a first portion of a substrate, and a second nanosheet field-effect transistors formed on a second portion of the substrate. The first nanosheet field-effect transistor formed on the first portion of a substrate may include a first source drain epitaxy. The second nanosheet field-effect transistor formed on the second portion of the substrate may include a second source drain epitaxy and a third source drain epitaxy. A top surface of the first source drain epitaxy may be above a top surface of a top-most nanosheet channel layer. A top surface of the third source drain epitaxy may be above the top surface of the top-most nanosheet channel layer. The semiconductor structure may include an etch stop liner around the first source drain epitaxy. The etch stop liner may separate the first source drain epitaxy from an interlayer dielectric. The semiconductor structure may include an isolation layer separating the substrate from the first source drain epitaxy and the second source drain epitaxy, and a shallow trench isolation separating the first nanosheet field-effect transistor formed on the first portion of a substrate from the second nanosheet field-effect transistor formed on the second portion of a substrate. The first source drain epitaxy may be made of phosphorous doped silicon. The second source drain epitaxy may be made of boron doped silicon. The third source drain epitaxy may be made of pure germanium or silicon germanium doped with a high germanium percentage. The first nanosheet field-effect transistor or the second nanosheet field-effect transistor may be a p-type nanosheet field-effect transistors. The first nanosheet field-effect transistor or the second nanosheet field-effect transistor may be a n-type nanosheet field-effect transistors.

According to another embodiment of the present invention, a method is provided. The method may include forming one or more nanosheet field-effect transistors on a substrate. The one or more nanosheet field-effect transistors may include forming a first source drain epitaxy with a protective etch stop liner on a first portion of the substrate, forming a second source drain epitaxy on a second portion of the substrate, recessing a portion of the first source drain epitaxy, and forming a third source drain epitaxy, wherein the third source drain epitaxy is u-shaped. The method may include forming one or more nanosheet channel layers, and forming one or more metal contacts. At least one of the one or more nanosheet channel layer may be connected to the third source drain epitaxy. At least one of the one or more metal contacts may extend vertically to the at least one of the one or more nanosheet channel layers. At least one of the one or more metal contacts may extend vertically to the at least one of the one or more nanosheet channel layers and may transfers compressive stress on to the at least one of the one or more nanosheet channel layers. The method may include forming an isolation layer separating the substrate from the first source drain epitaxy and the second source drain epitaxy, and forming a shallow trench isolation separating the one or more nanosheet field-effect transistors formed on the first portion of a substrate from the one or more nanosheet field-effect transistors formed on the second portion of a substrate. The first source drain epitaxy may be made of phosphorous doped silicon. The second source drain epitaxy may be made of boron doped silicon. The third source drain epitaxy may be made of pure germanium or silicon germanium doped with a high germanium percentage. The one or more nanosheet field-effect transistors formed on the first portion or the second portion of the substrate may be a p-type nanosheet field-effect transistors. The one or more nanosheet field-effect transistors formed on the first portion or the second portion of the substrate may be a n-type nanosheet field-effect transistors.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
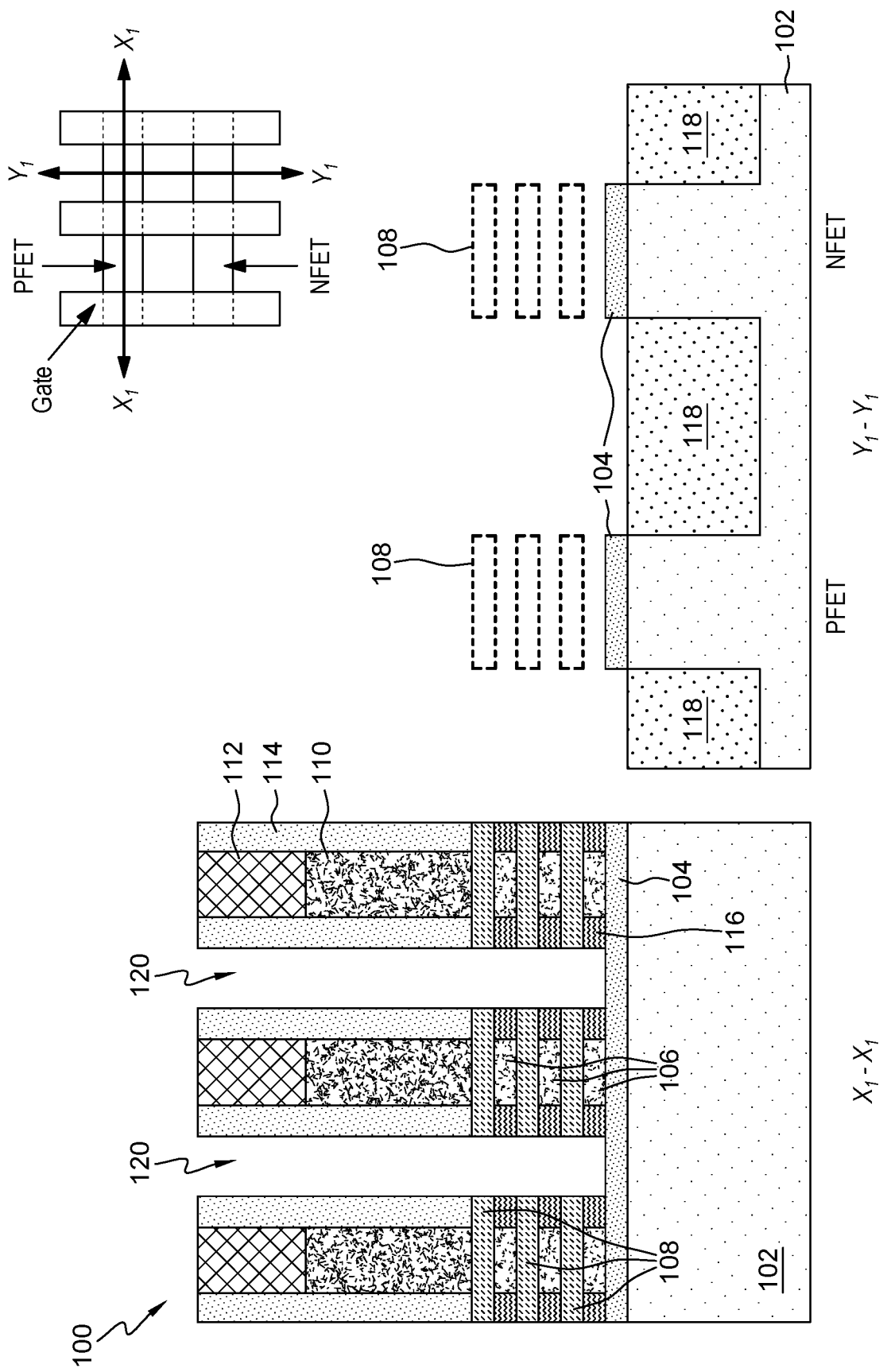
FIG. 1 is a cross section view illustrating a structure post nanosheet channel layers, sacrificial gates, isolation layer, and inner spacers formation according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Integrated circuit (IC) designs are often driven by device performance, scalability, and manufacturability. For example, nanosheet FETs were developed to improve device drive current and electrostatics and to allow for device size scaling. As stated above, a typical body of a nanosheet FET may include multiple nanosheet channel layers arranged as a layered stack. Initially, the nanosheet channel layers may be arranged in a layer stack and may be separated by sacrificial layers. The sacrificial layers may contain a material (e.g., silicon-germanium) that can be etched selectively to the material (e.g., silicon) constituting the nanosheet channel layers.

Utilizing current manufacturing processes, the sacrificial layers are etched and removed, while the nanosheet channel layers remain intact, to provide spaces for the formation of a gate stack. However, during the etching of the sacrificial layers, the etch process may damage the already formed source drain epitaxy. As a result, the nanosheet FET loses its structural and electrical integrity. In addition, current manufacturing processes allow for the source drain epitaxy to laterally grow from edges of the nanosheet channel layers. However, due to the fact that the substrate under the source drain epitaxy region is covered by a bottom isolation layer, there is no nucleation site at the bottom during the source drain epitaxy growth. As a result, the source drain epitaxy grows laterally from the exposed sidewalls of the nanosheet channels and includes defective areas that impact the performance of the nanosheet FET and prevent otherwise beneficial and desired stress on the nanosheet channel layers. The present invention provides a method and structures that includes a nanosheet FET with a source drain epitaxy replacement that generates desirable stress on the nanosheet channel layers and thereby improves the overall performance of the nanosheet FET.

FIGS. 1-13 illustrate fabrication of an exemplary semiconductor structure that includes a nanosheet field effect transistor (FET) with a source drain epitaxy replacement.

Referring now to FIG. 1, a structure 100 post formation of nanosheet channel layers 108, sacrificial gates 110, an isolation layer 104, and inner spacers 116 is shown, in accordance with an embodiment. The structure 100 is shown in two cross sections. Section $X_1$-$X_1$ is perpendicular to a gate over the nanosheet pFET and section $Y_1$-$Y_1$ is across the nanosheet pFET and the nanosheet nFET source drain region. The nanosheet channel layers 108 are formed using know techniques in the art.

The structure 100 includes the isolation layer 104 arranged on a substrate 102, sacrificial layers 106 arranged between the nanosheet channel layers 108, the sacrificial gates 110 formed over nanosheet channel layers 108, hard mask caps 112, a gate spacer 114 surrounding the sacrificial gates 110 and the hard mask caps 112, and the inner spacers 116. The structure 100 also includes shallow trench isolation (STI) regions 118.

The substrate 102 may be made of silicon. The substrate may be divided into one or more portions. For example, in an embodiment, a first portion of the substrate 102 may include a nanosheet pFET and a second portion of the substrate 102 may include a nanosheet nFET. In order to form the nanosheet channel layers 108, an epitaxy stack (not shown) is first grown on the substrate 102 using known epitaxial growth processes such as, for example, molecular beam epitaxy. The epitaxy stack includes alternating sacrificial layers 106 and nanosheet channel layers 108. The epitaxy stack also includes a base layer that is positioned between the substrate 102 and the bottom first sacrificial layer 106. The base layer may be made of silicon germanium where the germanium is at a concentration range of about 45% to about 65%. The sacrificial layers 106 may be made of silicon germanium where the germanium is at a concentration range of about 15% to about 35%. As such, the sacrificial layers 106 includes germanium at a lower concentration when compared to the base layer. The nanosheet channel layers 108 may be made of silicon. Therefore, the sacrificial layers 106, the nanosheet channel layers 108, and the base layer are made of materials with compositions that are selected to be removed selective to each other. As a result, during further manufacturing processing, the base layer is selectively removed and the isolation layer 104 is formed in its place.

The sacrificial gates 110 may be formed by first depositing a sacrificial gate material, such as, for example, a thin layer of SiO2 followed by amorphous silicon (a-Si) or polycrystalline silicon (polysilicon) on top of structure 100. The sacrificial material may be deposited by a deposition process, including, but not limited to, PVD or CVD. A hard mask is then deposited on top of the sacrificial gate material and patterned. An anisotropic etch process such as, for example, a RIE process may be used to form the sacrificial gates 110. The sacrificial gates 110 may have a spaced-apart arrangement along the length of the nanosheet channel layers 108 and may be aligned transverse to the nanosheet channel layers 108. The sacrificial gates 110 are covered by a hard mask cap 112. The hard mask cap 112 may include one or more dielectric materials, such as a layered combination of silicon dioxide and silicon nitride.

The isolation layer 104 may be made of dielectric material such as, for example, silicon dioxide, silicon nitride, or a low-k dielectric such as SiBCN, SiOC, and SiOCN. The isolation layer 104 may be referred to as a bottom isolation layer. The isolation layer 104 is formed on the top surface of the substrate 102 and is in direct contact with a bottom surface of the bottom most sacrificial layer 106. The isolation layer 104 is formed by first selectively removing the high Ge % SiGe base layer, followed by refilling the region with a dielectric. In an embodiment, the isolation layer 104 separates the substrate 102 from the gate region and provides an electrical disconnect such that the gate region is electrically isolated from the substrate 102. In an alternative embodiment, the isolation layer 104 separates the substrate 102 from a source/drain region of a FET and provides an electrical disconnect such that the source/drain region is electrically isolated from the substrate 102. In yet another embodiment, the isolation layer 104 isolates both the source/drain region and the gate region from the substrate 102.

In addition to the formation of the isolation layer 104, the gate spacer 114 is formed on the top surfaces of the structure 100. That is, the isolation layer 104 and the gate spacer 114 is formed simultaneously using the same conformal deposition of dielectric. The gate spacer 114 may be made of silicon dioxide, silicon nitride, or a low-k dielectric such as SiBCN, SiOC, and SiOCN. The gate spacer 114 is formed at the sidewalls of the sacrificial gates 110 and cover the hard mask caps 112.

After the gate spacer 114 is formed, the structure 100 undergoes a self-aligned etching process during which the sacrificial gates 110 operate as an etch mask. The self-aligned etching, which may be an anisotropic RIE process, may utilize one or more etch chemistries to etch the gate spacer 114, the nanosheet channel layers 108, and sacrificial layers 106. The etching process creates trenches 120. The trenches 120 extend from an exposed top surface of the hard mask cap 112 to the exposed top surface of the isolation layer 104. Further, using a dry or wet isotropic etching process, the sacrificial layers 106 are then laterally recessed, selective to the nanosheet channel layers 108. Since the nanosheet channel layers 108 are not recessed, the lateral recessing of the sacrificial layers 106 forms indents between these nanosheet channel layers 108. The indents extend laterally the width of the gate spacer 114 (i.e., the indents extend laterally from the inner sidewall to the outer sidewall of the gate spacer 114). The indents are then filled by pinch-off mechanism, using a deposition process such as ALD, with a dielectric material, such as silicon nitride or any other low-k dielectric material, to form the inner spacers 116.

An isotropic etch process may then be used to remove any dielectric material remaining such that the dielectric material only remains within the indents. In addition to the above, the structure 100 also undergoes processing to form the STI regions 118. The STI regions 118 are formed of a dielectric plug that separates adjacent devices such as, for example, adjacent devices within the structure 100. For example, electrical current applied to the nanosheet pFET within the structure 100 has no effect on the adjacent nanosheet nFET within the structure 100. The STI regions 118 may be made of an oxide material and may be formed by depositing an oxide material such as, for example, silicon oxide, onto the top surfaces of the structure 100, followed by oxide planarization and oxide recess.

With continued reference to FIG. 1, as stated above, section $Y_1$-$Y_1$ is across the nanosheet pFET and the nanosheet nFET, cut along the source drain epitaxy. As a result, the nanosheet channel layers 108 in section $Y_1$-$Y_1$ are already etched away at this fabrication stage, and thus are illustrated as dashed rectangles.

Figure 2:
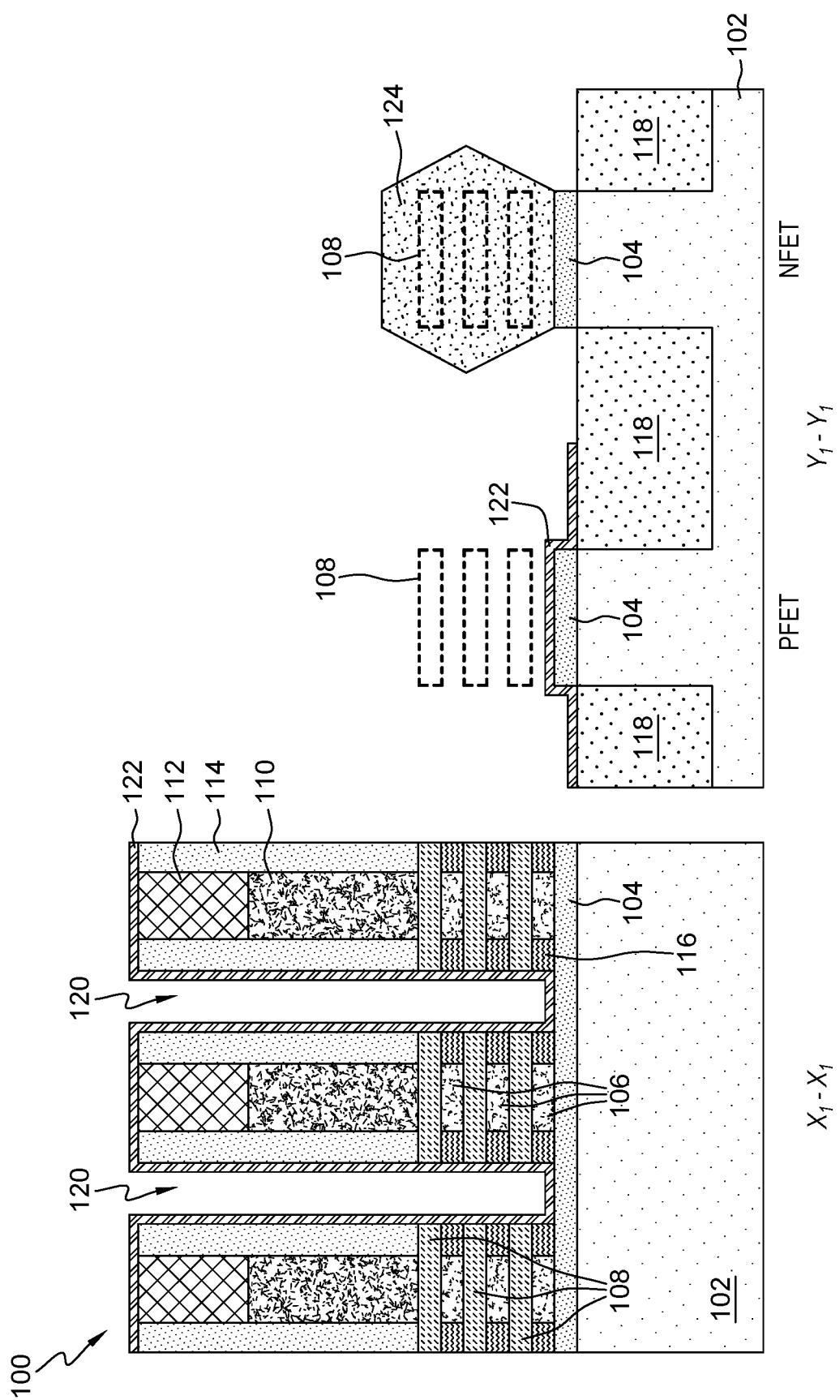
FIG. 2 is a cross section view illustrating a first source drain epitaxy formed on an nFET portion of the structure according to an exemplary embodiment.

Referring now to FIG. 2, the structure 100 with a first liner 122 and a first source drain epitaxy is shown, in accordance with an embodiment. The first liner 122 is conformally deposited, using known deposition techniques, onto the structure 100. The first liner 122 may be made of dielectric material such as, for example, silicon nitride. The first liner 122 is then patterned such that the first liner 122 remains on top of the pFET portion of the structure 100. The first liner 122 is removed from the nFET portion of the structure 100, exposing the sidewalls of the nanosheet layers 108 in the NFET portion. From the exposed sidewalls of the nanosheet layers 108 in the NFET portion, the first source drain epitaxy 124 is formed, using known epitaxy growth processes. The first source drain epitaxy 124 may be made of phosphorous doped silicon.

Figure 3:
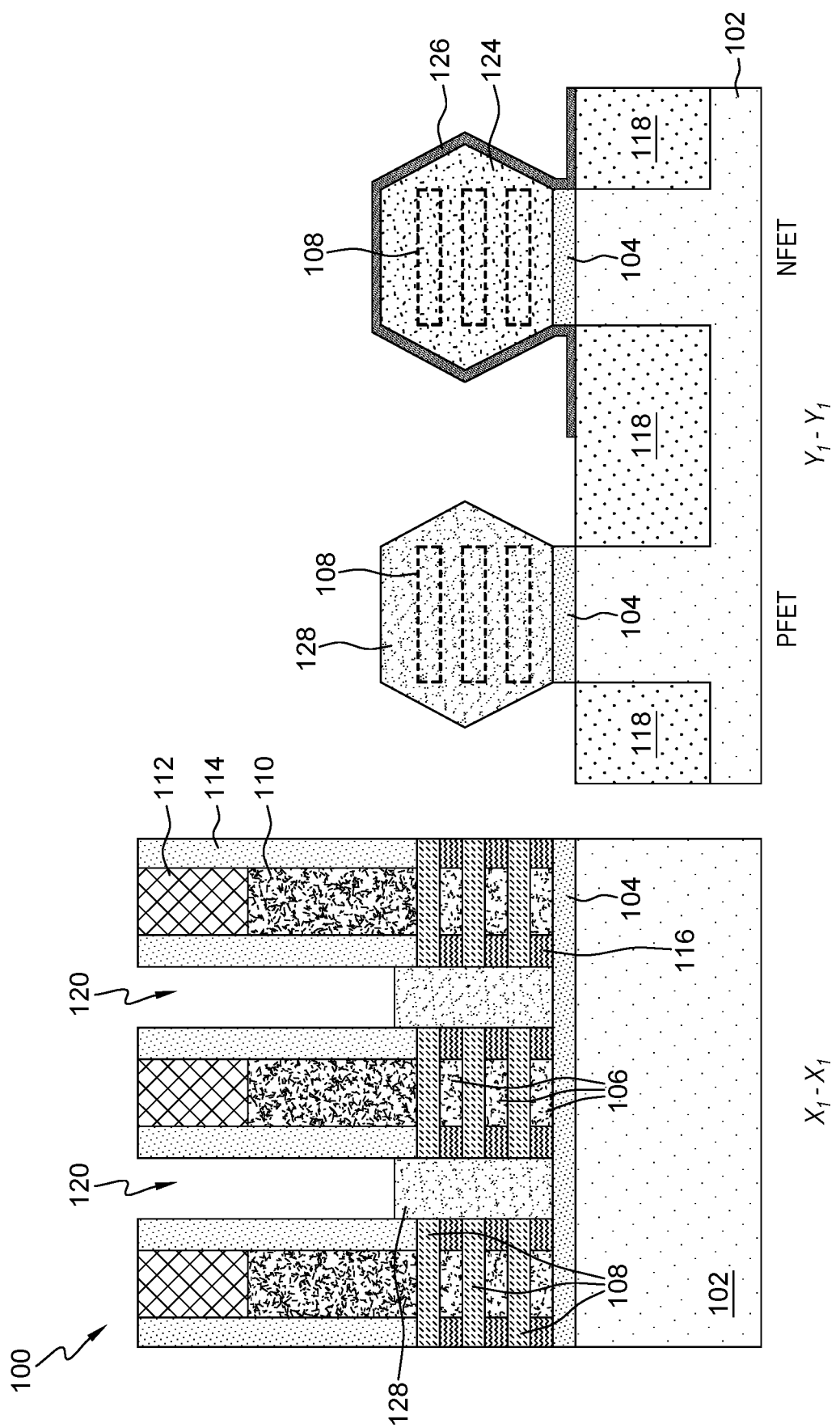
FIG. 3 is cross section views illustrating a second source drain epitaxy formed on a pFET portion of the structure according to an exemplary embodiment.

Referring now to FIG. 3, the structure with a second liner 126 and a second source drain epitaxy 128 is shown, in accordance with an embodiment. After the first source drain epitaxy 124 is formed in the nFET region of the structure 100, the first liner 122 is removed from the top surface of the structure 100 using known removal techniques. The second liner 126 is then conformally deposited, using known deposition techniques such as, atomic layer deposition (ALD), on top of the structure 100. The second liner 126 may be made of a different dielectric material than conventional nitride liner or nitride spacer, such as silicon carbide or silicon oxycarbide. The second liner 126 may be referred to as an etch stop liner.

The second liner 126 is patterned such that the second liner 126 remains on the top surface of the first source drain epitaxy in the nFET region of the structure 100. The second liner 126 is removed from the pFET portion of the structure 100, exposing the sidewall surfaces of the nanosheets 108 in the PFET region or portion of the structure 100. On the exposed sidewall surfaces of the nanosheets 108, the second source drain epitaxy 128 is formed, using known epitaxy growth processes. The second source drain epitaxy 128 may be made of boron doped silicon. Conventionally, the second source drain epitaxy 128 is made of boron doped silicon germanium. Embodiments of the present invention propose using boron dope silicon as the material that forms the second source drain epitaxy 128. As a result, during subsequent processes of manufacture, especially during the removal of the sacrificial layers 106, the second source drain epitaxy 128 is not damaged.

Figure 4:
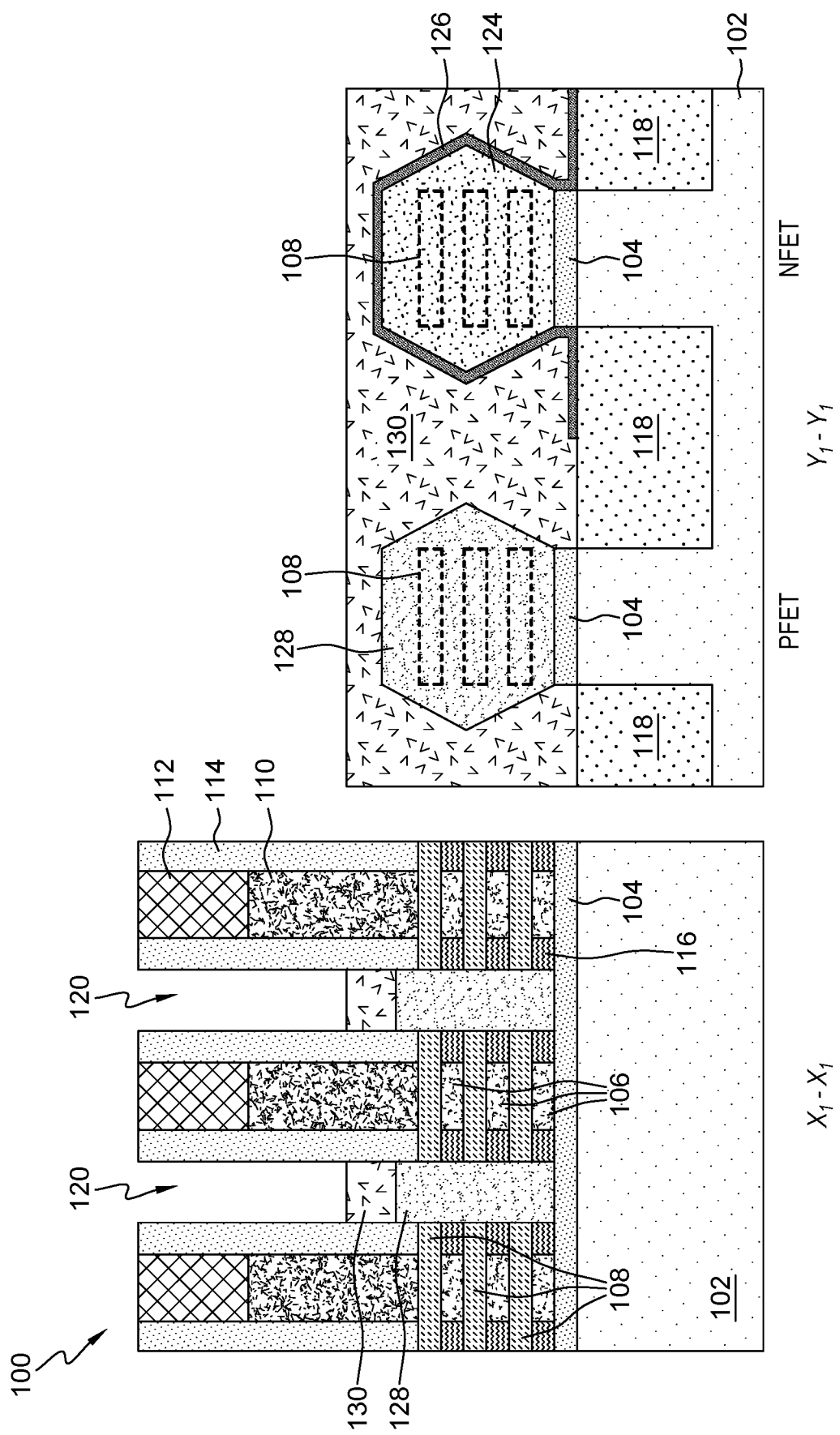
FIG. 4 is a cross section view illustrating the structure having an organic planarization layer according to an exemplary embodiment.

Referring now to FIG. 4, the structure 100 with an organic planarization layer (OPL) 130 is shown, in accordance with an embodiment. The OPL 130 is deposited on top of the structure 100, filling the trenches 120. The OPL 130 is then partially recessed such that only a portion of the OPL 130 remains within the trenches 120. In addition to the recessing of the OPL 130, the second liner 126 (not shown) is also removed from within the trenches 120 of the nFET portion of the structure 100. As a result, portions of the sidewalls of the gate spacers 114 are exposed. In addition, removing the second liner 126 within the trenches 120 allows for the trenches 120 to be big enough to be filled with other materials during subsequent steps of manufacture.

Figure 5:
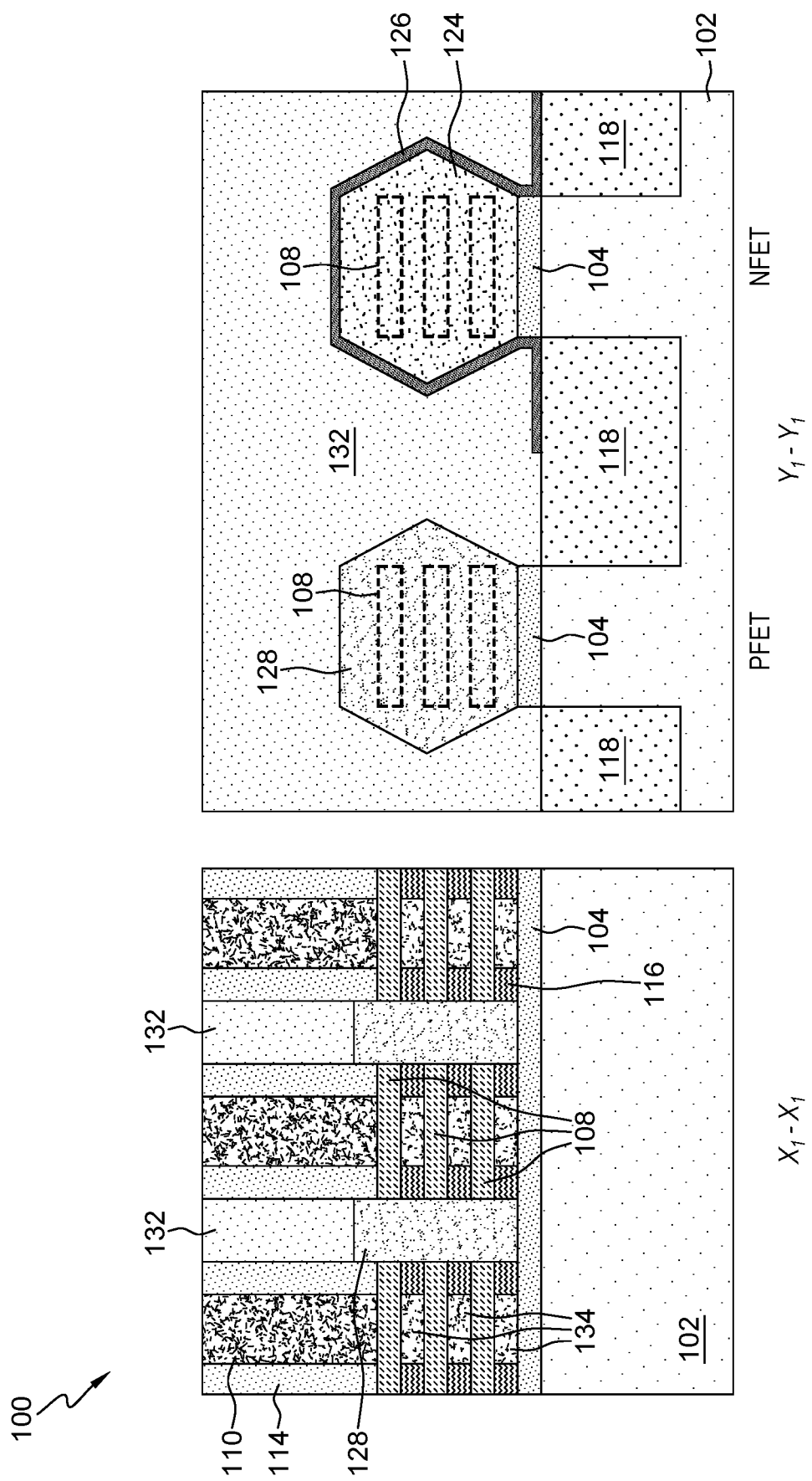
FIG. 5 is a cross section view illustrating the structure with a first interlayer dielectric (ILD) according to an exemplary embodiment.

Referring now to FIG. 5, the structure with a first interlayer dielectric (ILD) 132 is shown, in accordance with an embodiment. The OPL 130 is first removed from the structure 100 using an ash removal process. This process removes the OPL 130 from within the trenches 120, exposing the top surface of the second source drain epitaxy and the top surface of the second liner 126.

After the OPL 130 is removed, the first ILD 132 is deposited on top of the structure 100 such that the trenches 120 (illustrated in FIGS. 1-4) are filled. The first ILD 132 is deposited using known deposition techniques such as ALD, chemical vapor deposition (CVD), high density plasma (HDP) deposition, etc. The first ILD 132 may be composed of a dielectric material, such as a thin SiN followed by silicon dioxide. Once deposited, the structure 100 may undergo a planarization process, such as chemical mechanical polishing (CMP), during which the hard mask cap 112 may be removed to expose top surfaces of the sacrificial gates 110.

Figure 6:
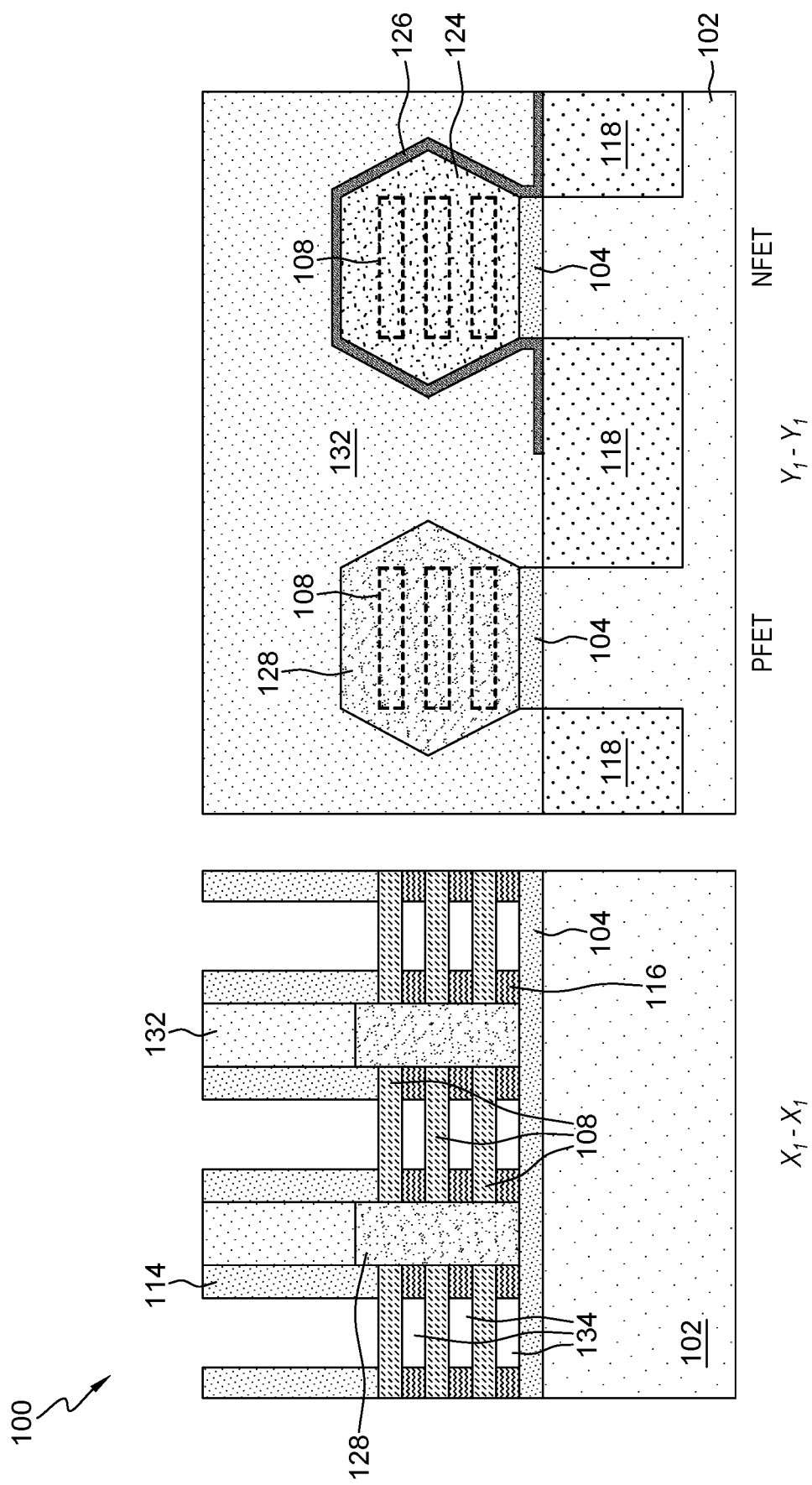
FIG. 6 is a cross section view illustrating the structure with spaces formed after the removal of sacrificial layers according to an exemplary embodiment.

Having the top surface of the sacrificial gates 110 exposed allows for the sacrificial gates 110 to be selectively removed with one or more etching processes. In addition, a plurality of the sacrificial layers 106 are also removed with an etching process that removes the material of the sacrificial layers 106 (i.e., silicon germanium with a germanium concentration range of about 15% to about 35%) selective to the materials of the nanosheet channel layers 108 and inner spacers 116. By removing the sacrificial layers 106, a plurality of spaces 134 surrounding the nanosheet channel layers 108, illustrated in FIG. 6, are created. The nanosheet channel layers 108, within the structure 100, are anchored at opposite ends by the inner spacers 116. Removing the sacrificial layers 106 does not damage the first source drain epitaxy 124 or the second source drain epitaxy 128 even if there are any missing inner spacer 116 or pin-holes in some or all of the inner spacers 116, because the first source drain epitaxy 124 is made of phosphorous doped silicon and the second source drain epitaxy 128 is made of boron doped silicon. That is, the first and second source drain epitaxies 124, 128 are made of materials that are selective to the materials that make up the sacrificial layers 106.

Figure 7:
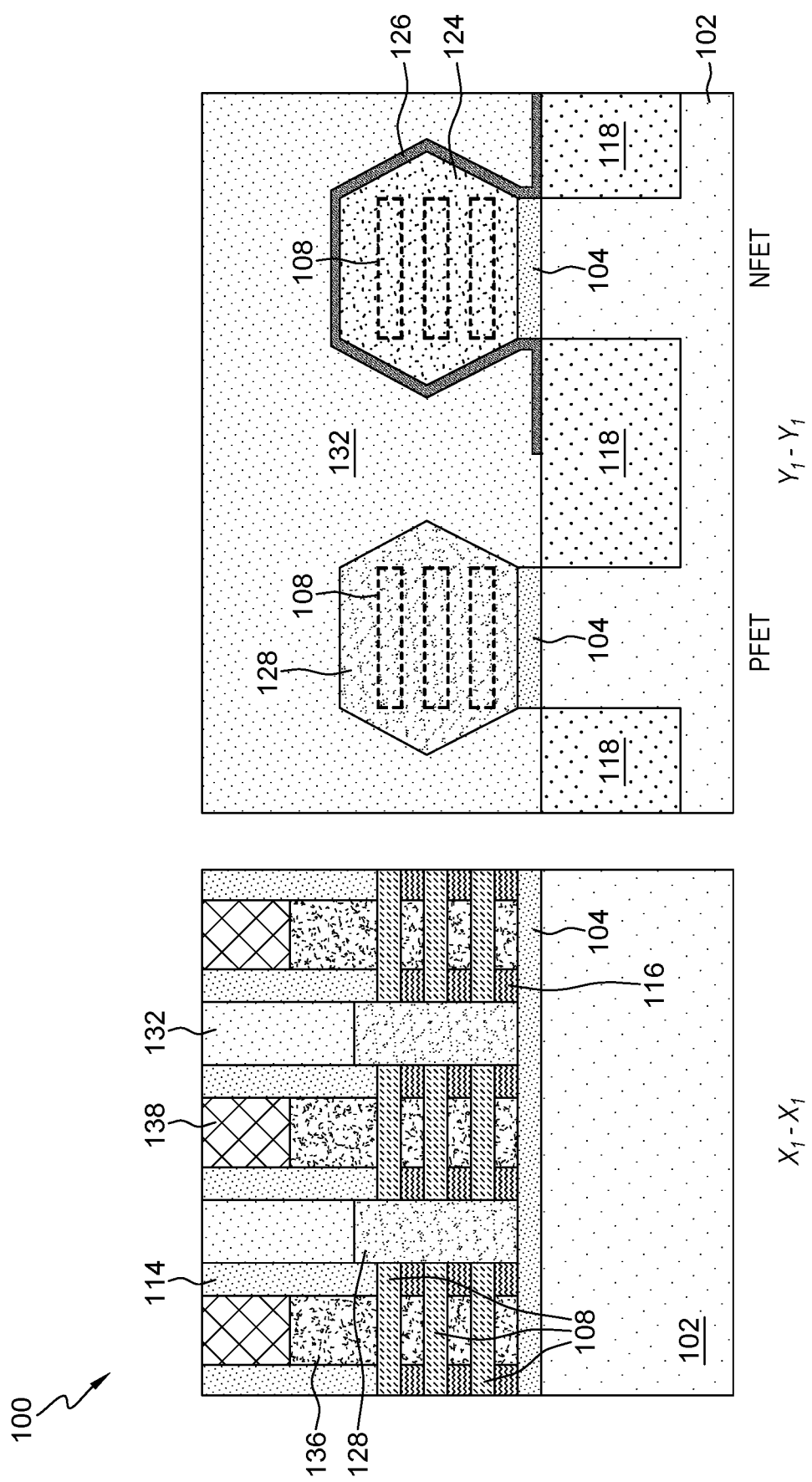
FIG. 7 is a cross section view illustrating the structure with metal gate stacks and self-aligned contact caps according to an exemplary embodiment.

Referring now to FIG. 7, after removing the sacrificial gates 110 and the sacrificial layers 106, the structure 100 undergoes a replacement gate process to form metal gate stacks 136. Portions of the metal gate stacks 136, within the structure 100, are formed in the spaces 134 (illustrated in FIG. 6) formerly occupied by the removed sacrificial layers 106. These portions of the metal gate stacks 136 may surround respective exterior surfaces of the nanosheet channel layers 108 in a gate-all-around (GAA) arrangement. In an embodiment, the gate dielectric that makes up the metal gate stack stacks 136 may be made of high-k gate dielectrics, such as $HfO_2$. In an alternative embodiment, the gate dielectric that makes up the metal gate stack stacks 136 may be made of a thicker oxide dielectric, such as silicon oxide ($SiO_2$). The metal gate stacks 136 may further include work function metals (such as TiN, TiAl, TiAlC, TaN, etc.) and low resistance metal fills (such as Al, W, Co, Ru, etc.). Once the metal gate stacks 136 are formed, the metal gate stacks 136 may be recessed and self-aligned contact caps 138 may be formed over the recessed metal gate stacks 136. The self-aligned contact caps 138 may be made of a dielectric material, such as silicon nitride.

Figure 8:
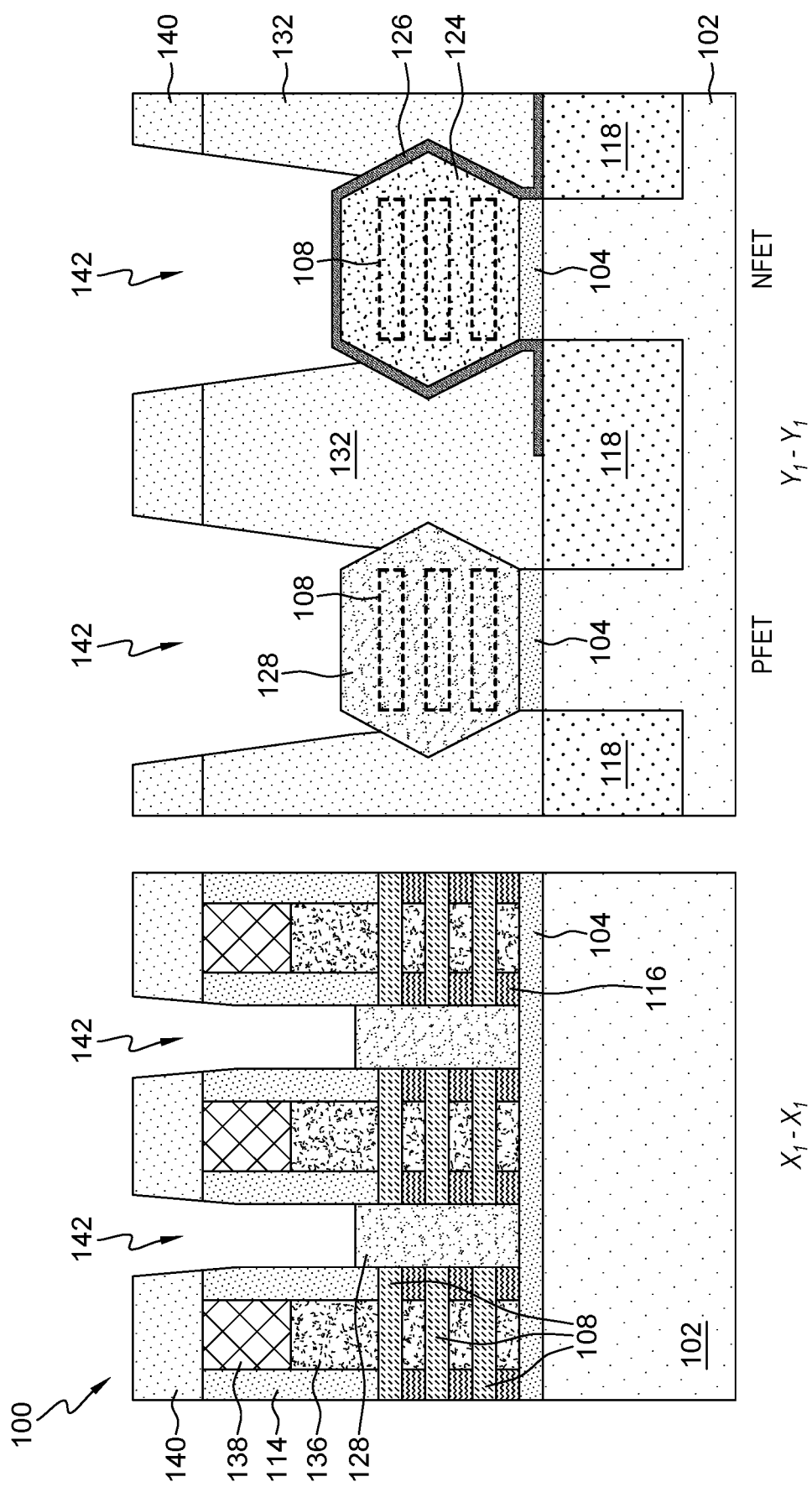
FIG. 8 is a cross section view illustrating the structure with openings formed above the first and second source drain epitaxies according to an exemplary embodiment.

Referring now to FIG. 8, the structure 100 with source drain contact openings 142 is shown, in accordance with an embodiment. A second ILD 140 is first deposited on top of the structure 100 using known deposition techniques. The second ILD 140 may be made of substantially the same material as the first ILD 132. The structure 100 then undergoes a lithography patterning and an etch process, such as a reactive ion etch process, to remove portions of the second ILD 140 and portions of the first ILD 132 directly above the first source drain epitaxy 124 and the second source drain epitaxy 128. The etch process removes the first and the second ILDs 132, 140 such that the top surface of the second source drain epitaxy 128 and the top surface of the second liner 126 is exposed.

Figure 9:
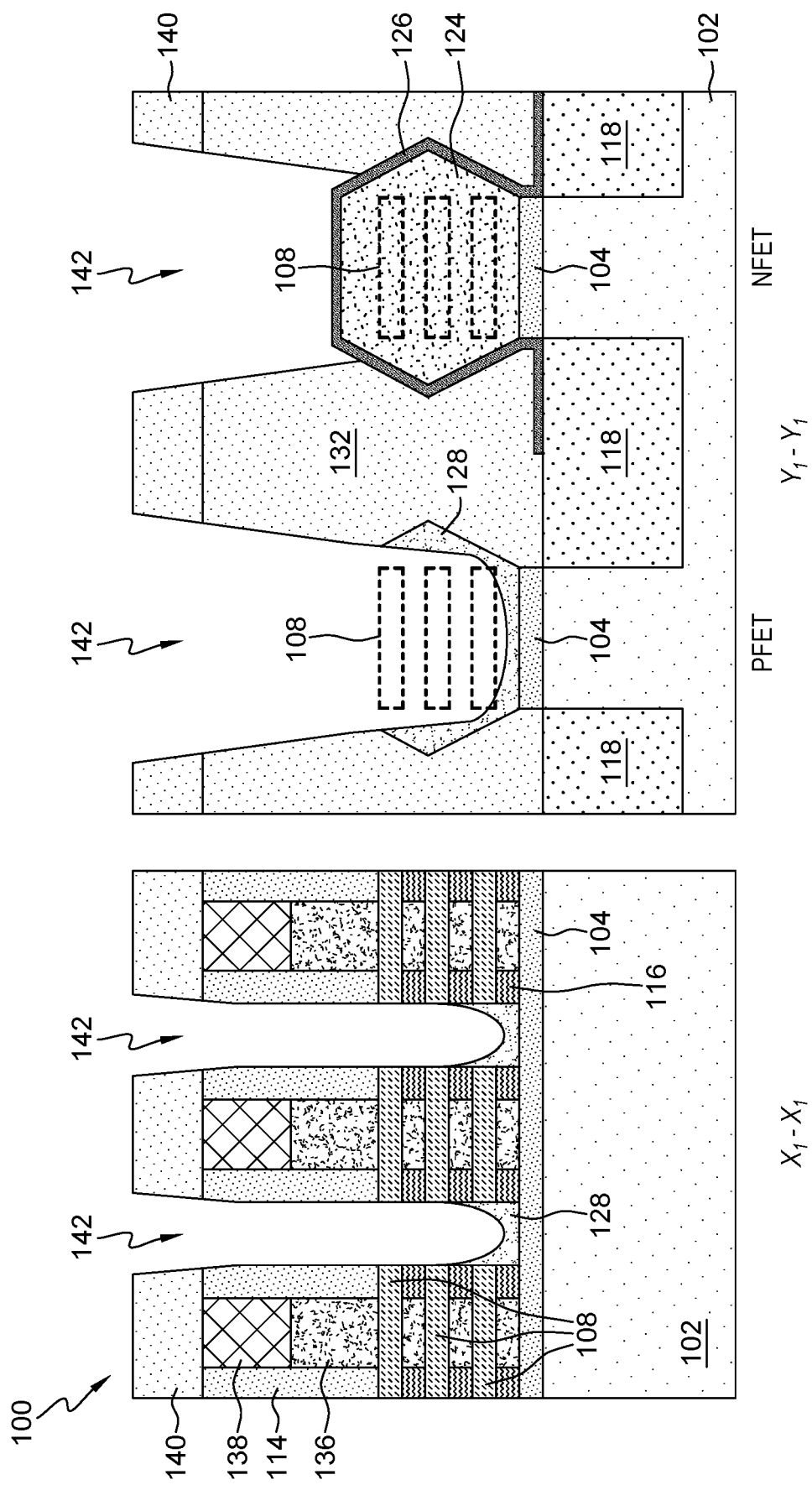
FIG. 9 is a cross section view illustrating the structure with most of the second source drain epitaxy selectively removed according to an exemplary embodiment.

Referring now to FIG. 9, the structure 100 undergoes another etch process during which most the second source drain epitaxy 128 is selectively recessed and sidewalls of one or more of the nanosheet channel layers 108 are exposed. The first source drain epitaxy 124 is not recessed because the first source drain epitaxy 124 is protected by the second liner 126. As a result, the first source drain epitaxy 124 remains unchanged and the second source drain epitaxy 128 is mostly recessed. Only a small portion of the second source drain epitaxy 128 remains along the sidewalls and the bottom of the opening 142. That is, during the selective recess process, a portion of the second source drain epitaxy 128 remains on the bottom of the opening 142, covering the top surface of the isolation layer 104.

Figure 10:
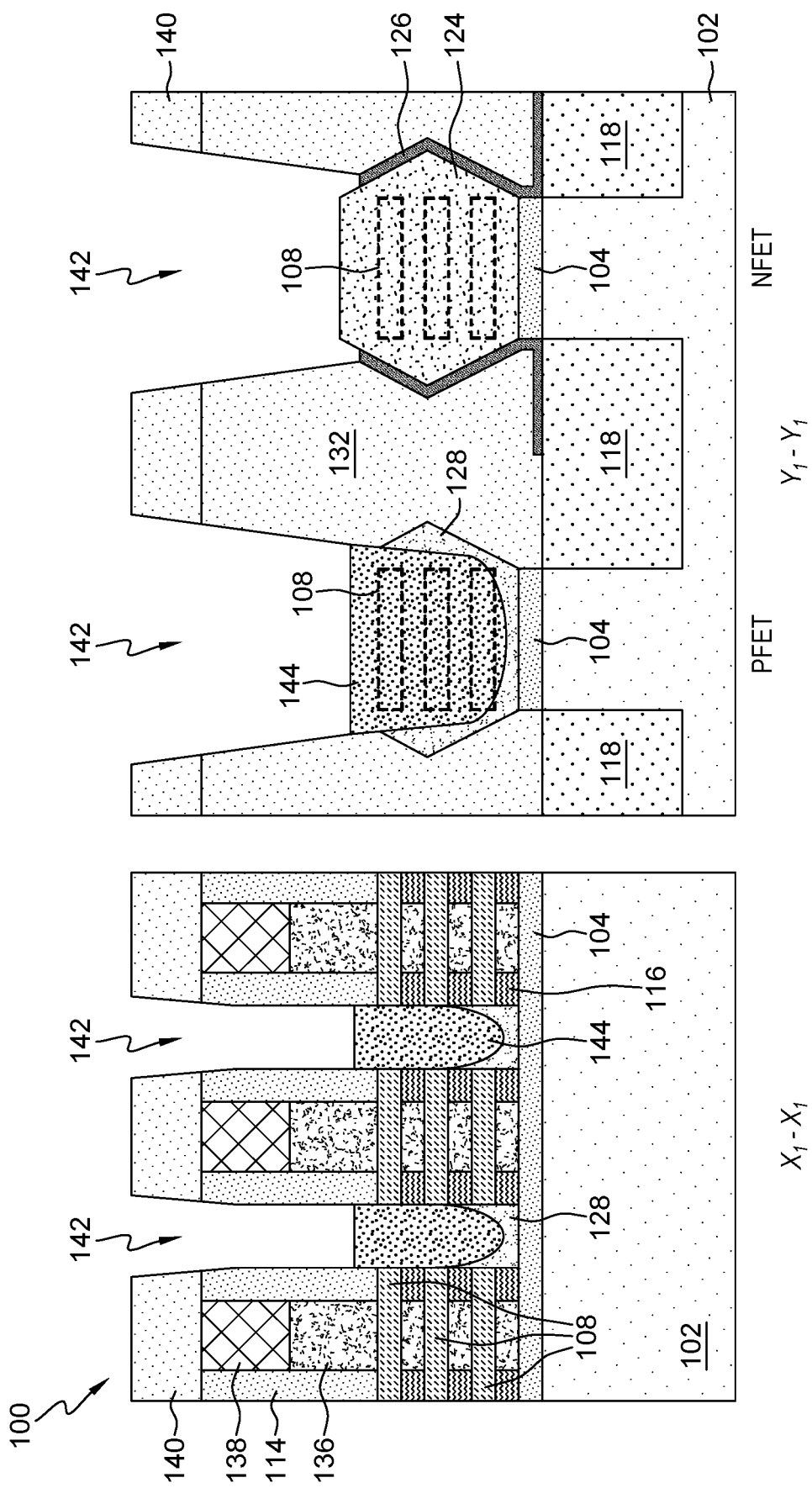
FIG. 10 is a cross section view illustrating the structure with a third source drain epitaxy formed on top of the remaining second source drain epitaxy according to an exemplary embodiment.

Referring now to FIG. 10, the structure 100 with a third source drain epitaxy 144 is shown, in accordance with an embodiment. The third source drain epitaxy 144 may be made of silicon germanium or pure germanium. For example, in an embodiment, when the third source drain epitaxy 144 is made of silicon germanium, the third source drain epitaxy 144 is grown in low temperature and in-situ doped with a high percentage of germanium. In addition, the third source drain epitaxy 144 may be doped with boron.

The third source drain epitaxy 144 grows on top of the second source drain epitaxy 128. Since sidewalls of the one or more nanosheet channel layers 108 are exposed as well as some of the second source drain epitaxy 128 remains at the sidewalls and the bottom of the openings 142, the third source drain epitaxy 144 grows laterally from one or more of the nanosheet channel layers 108 as well as from the bottom and is thus directly connected to at least one of the nanosheet channel layers 108. As a result, the third source drain epitaxy 144 has much better quality than the second source drain epitaxy 128 (e.g., in term of defects, stress, etc.). In addition, compared with a conventional way of forming late source drain epitaxy through contact holes, the third source drain epitaxy 144 (i.e., the final source drain epitaxy) for the PFET portion, having an additional portion of the second source drain epitaxy 128 remaining at the sidewalls and the bottom of the openings 142, may help lower the resistance of the pFET portion of the structure 100. That is, having a boron doped second source drain epitaxy 128 and third source drain epitaxy 144 reduces the resistance of the pFET portion of the structure 100. The third source drain epitaxy 144 grows such that its top surface is above the top surface of the top-most nanosheet channel layer 108.

Figure 11:
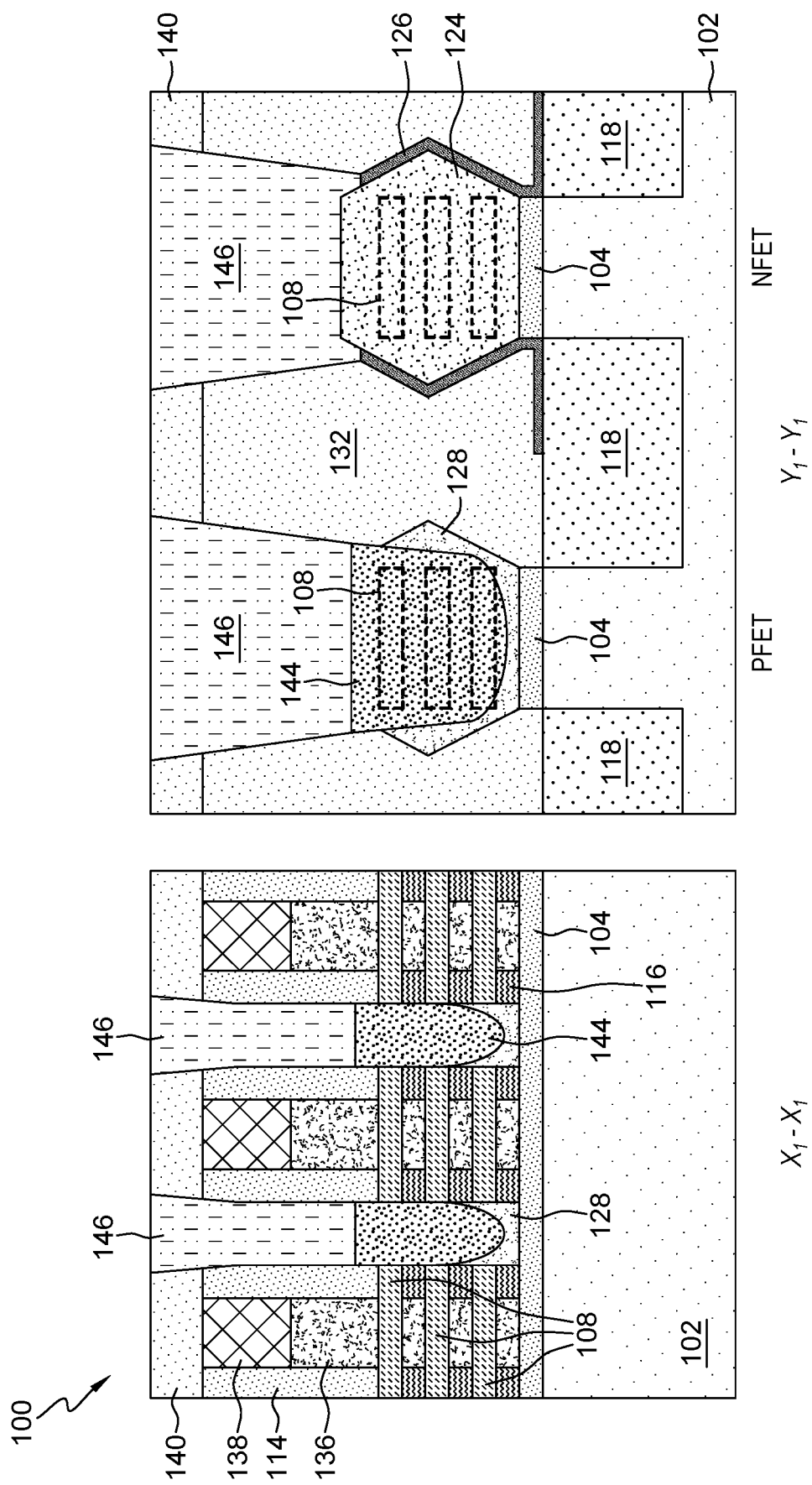
FIG. 11 is a cross section view illustrating the structure with metal contacts formed on top of each source drain epitaxy according to an exemplary embodiment.

Referring now to FIG. 11, the structure 100 with metal contacts 146 is shown, in accordance with an embodiment. A directional RIE may be used to remove the second liner 126 from the top surface of the first source drain epitaxy 124. As a result, the top surface of the first source drain epitaxy 124 is exposed. Openings 142 may first be lined with a silicide liner, made of Ti, Ni, or NiPt, using directional deposition process such as radio frequency physical vapor deposition (RFPVD), followed by conformally lined with a metal liner made of material, such as titanium, titanium nitride, or combination thereof. The openings 142 may then be filled to form the metal contacts 146. The metal contacts 146 may be composed of metal, such as tungsten, ruthenium, or cobalt, and extend vertically from a top surface of the second ILD 140 to the top surfaces of the first and third source drain epitaxies 124, 144. After the metal contacts 146 are formed they are planarized by CMP.

The resultant structure 100, illustrated in FIG. 11, includes a nanosheet that is a pFET and a nanosheet that is an nFET. The pFET nanosheet includes the third source drain epitaxy 144 that is grown on top of the remaining second source drain epitaxy 128. The third source drain epitaxy 144 may be referred to as the source drain epitaxy replacement because the third source drain epitaxy 144 replaces most of the second source drain epitaxy 128 within the pFET portion of the structure 100. The third source drain epitaxy 144 may be made of pure germanium or silicon germanium that is doped with a high germanium percentage. The first source drain epitaxy 124 may be made of phosphorous doped silicon.

As described above, typically, during the etching of the sacrificial layers 106 from the gate opening (illustrated in FIGS. 1-5), the source drain epitaxy may be damaged. This is due to the fact that a typical source drain epitaxy and the sacrificial layers 106 are made of the same material such as, for example, silicon germanium. During the etching of the sacrificial layers 106, the inner spacers 116 may be defective and as a result the etching process may damage the source drain epitaxy. Embodiments of the present invention provide a method of replacing the second source drain epitaxy 128 with the third source drain epitaxy 144 after the sacrificial layers 106 are removed. That is, the third source drain epitaxy 144, made of silicon germanium or pure germanium, is not damaged by the etching of the sacrificial layers 106 because the sacrificial layers 106 are etched before the third source drain epitaxy 144 is grown on the remaining portion of the second source drain epitaxy 128. Further, the etching of the sacrificial layers 106 does not damage the first source drain epitaxy 124 because the first source drain epitaxy 124 (nanosheet nFET) may be made of phosphorous doped silicon. As a result, the sacrificial layers 106 may be etched selective to the first source drain epitaxy 124. In addition, growing the third source drain epitaxy 144 on top of the remaining second source drain epitaxy 128 is beneficial because the third source drain epitaxy 144 uniformly grows throughout the bottom portion of the opening 142. The third source drain epitaxy 144 includes less defects, when compared to the second source drain epitaxy 128 that is initially grown, and generates better stress for PFET.

Another embodiment by which to form a semiconductor structure that includes a nanosheet FET with a source drain epitaxy replacement is described in detail below by referring to the accompanying FIGS. 12-13.

Figure 12:
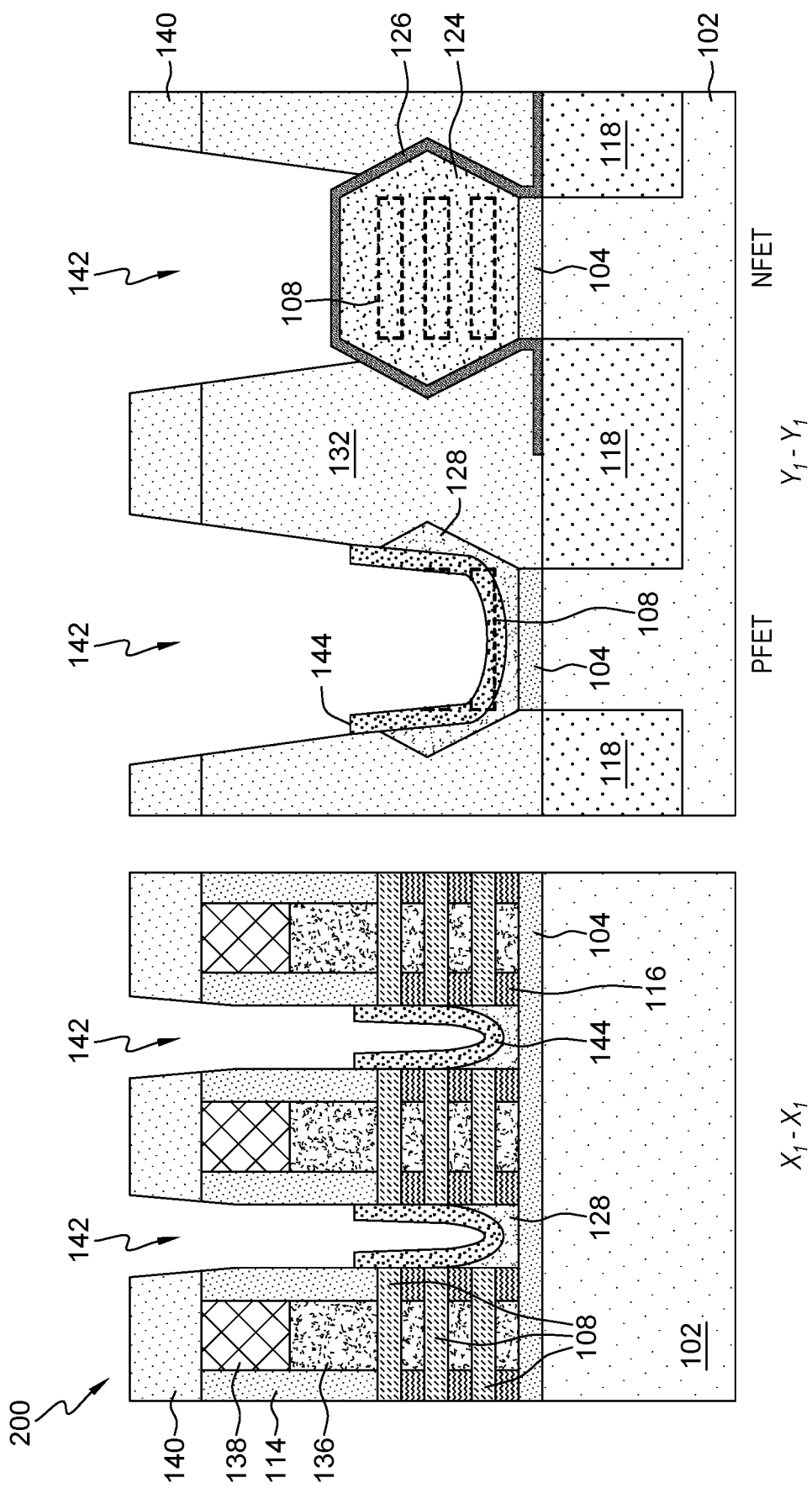
FIG. 12 is a cross section view illustrating the structure with a thin conformal third source drain epitaxy formed on top of the remaining second source drain epitaxy according to an exemplary embodiment.

Referring now to FIG. 12, a structure 200 is shown according to yet another embodiment of the invention. The structure 200 may be substantially similar in all respects to structure 100, described in detail above; however, in the present embodiment, a thin conformal third source drain epitaxy 144 is formed on top of the remaining second source drain epitaxy 128.

Beginning with the structure 100 of FIG. 9, an etch process is performed during which most of the second source drain epitaxy 128 is selectively recessed from the pFET portion of the structure 100, resulting sidewalls of one or more of the nanosheet channel layers 108 being exposed. That is, during the selective recess process, a portion of the second source drain epitaxy 128 remains on the bottom of the opening 142, covering the top surface of the isolation layer 104. The first source drain epitaxy 124 is not recessed because the first source drain epitaxy 124 is protected by the second liner 126. After the selective recessing of most of the second source drain epitaxy 128, the third source drain epitaxy 144 is conformally grown in low temperature along the bottom portions of the sidewalls and bottom of the opening 142. The resulting structure 200, illustrated in FIG. 12, includes the third source drain epitaxy 144 that is thin and conformally u-shaped and in directly connected to the sidewalls of the exposed one or more nanosheet channel layers 108. The third source drain epitaxy 144 does not completely fill the bottom portion of the opening 142. Rather, the third source drain epitaxy 144 is grown such that a space between the inner sidewalls of the third source drain epitaxy 144 remains.

Figure 13:
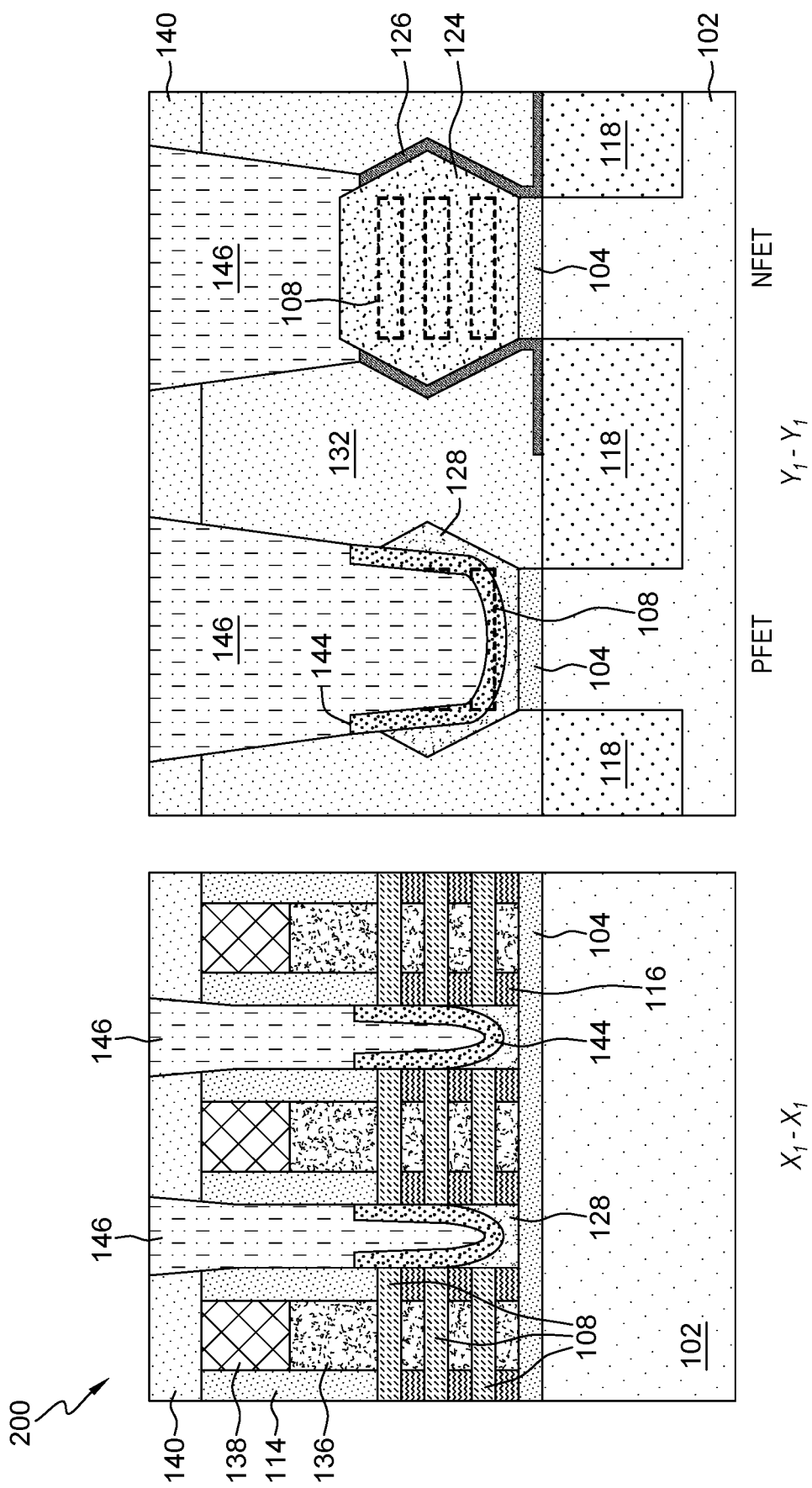
FIG. 13 is a cross section view illustrating the structure with metal contacts formed on top of each source drain epitaxy according to an exemplary embodiment.

Referring now to FIG. 13, the structure 200 undergoes further processing to form the metal contacts 146. A directional RIE may be used to remove the second liner 126 from the top surface of the first source drain epitaxy 124. As a result, the top surface of the first source drain epitaxy 124 is exposed. After which, the openings 142 may first be lined with a silicide liner such as Ti, Ni, or NiPt, followed by a conformal metal liner (not shown) made of material, such as titanium, titanium nitride, or combination thereof, and then filled to form the metal contacts 146. The metal contacts 146 may be composed of metal, such as tungsten or cobalt. The metal contacts 146 within the nFET portion of the structure 200 may extend vertically from a top surface of the second ILD 140 to the top surface of the first source drain epitaxy 124. The metal contacts 146 within the pFET portion of the structure 200 may extend vertically from the top surface of the second ILD 140 to the top surface of the third source drain epitaxy 144, filling the opening 142 remaining. That is, the metal contacts 146 within the pFET portion of the structure 200 fill the space between the inner sidewalls of the third source drain epitaxy 144. As a result, the metal contacts 146 vertically extend to the bottom most nanosheet channel layer 108.

Typically, materials used to form the metal contacts 146 may transfer a substantial amount of stress to the nanosheet channel layers 108. For the nanosheet nFET, tensile stress is desired because tensile stress is favorable for electron mobility. If compressive stress is applied to the nanosheet nFET, the performance of the nanosheet nFET may be degraded due to lower electron mobility. However, for the nanosheet pFET (i.e., pFET portion of the structures 100, 200), compressive stress is most beneficial because compressive stress is beneficial for higher hole mobility. This allows for the integrated circuit to work more efficiently. The compressive stress may be achieved with the resultant structure 200, illustrated in FIG. 13.

As described above, the metal contacts 146 within the pFET portion of the structure 200 fill the space between the inner sidewalls of the third source drain epitaxy 144. That is, the metal contacts 146 vertically extend to the bottom most nanosheet channel layers 108. Since the metal contacts 146 extend to the bottom most nanosheet channel layers 108, the metal contacts 146 may transfer the stress onto all of the nanosheet channel layers 108. For example, the nanosheet channel layers 108 between the metal contacts 146 may exhibit compressive stress because the metal contact 146 on the left and the metal contact 146 on the right may produce stress that pushes toward the nanosheet channel layers 108 between the metal contacts 146. Further, this type of compressive stress is not exhibited within the nFET portion of the structure 200 because the top surface of the first source drain epitaxy 124 is above the top surface of the top-most nanosheet channel layers 108. The metal contacts 146 within the nFET portion of the structure 200 do not extend to the nanosheet channel layers 108. As a result, the metal contacts 146 are unable to transfer their stress onto the nanosheet channel layers 108.

The resultant structure 200, illustrated in FIG. 13, includes the third source drain epitaxy 144 conformally formed into a thin u-shaped epitaxy. The third source drain epitaxy 144 may be referred to as the source drain epitaxy replacement because the third source drain epitaxy 144 replaces most of the second source drain epitaxy 128 within the pFET portion of the structure 200 after the sacrificial layers 106 are etched. As a result, the third source drain epitaxy 144 that grows on top of the remaining second source drain epitaxy 128, effectively replacing the second source drain epitaxy 128, is not damaged; rather, the third source drain epitaxy 144 has good quality.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure, comprising:
    a first nanosheet field-effect transistor formed on a first portion of a substrate, the first nanosheet field-effect transistor formed on the first portion of the substrate includes a first source drain epitaxy, wherein a top surface of the first source drain epitaxy is above a top surface of a top-most nanosheet channel layer;
    a second nanosheet field-effect transistor formed on a second portion of the substrate, the second nanosheet field-effect transistor formed on the second portion of the substrate includes a second source drain epitaxy and a third source drain epitaxy, wherein the second source drain epitaxy is below the third source drain epitaxy, wherein the third source drain epitaxy is u-shaped and is directly connected to at least one nanosheet channel layer; and
    one or more metal contacts, wherein at least one of the one or more metal contacts extends vertically from a top surface of an interlayer dielectric to the at least one nanosheet channel layer.

2. The semiconductor structure of claim 1, wherein at least one of the one or more metal contacts transfers compressive stress on to the at least one nanosheet channel layer.

3. The semiconductor structure of claim 1, further comprising:
    an isolation layer separating the substrate from the first source drain epitaxy and the second source drain epitaxy; and
    a shallow trench isolation separating the first nanosheet field-effect transistor formed on the first portion of the substrate from the second nanosheet field-effect transistor formed on the second portion of the substrate.

4. The semiconductor structure of claim 1, wherein the first source drain epitaxy is made of phosphorous doped silicon.

5. The semiconductor structure of claim 1, wherein the second source drain epitaxy is made of boron doped silicon.

6. The semiconductor structure of claim 1, wherein the third source drain epitaxy is made of pure germanium or silicon germanium doped with a high germanium percentage.

7. The semiconductor structure of claim 1, wherein the first nanosheet field-effect transistor is a n-type nanosheet field-effect transistor and the second nanosheet field-effect transistor is a p-type nanosheet field-effect transistors.

8. The semiconductor structure of claim 1, wherein the first nanosheet field-effect transistor is a p-type nanosheet field-effect transistor and the second nanosheet field-effect transistor is a n-type nanosheet field-effect transistors.

9. A semiconductor structure, comprising:
a first nanosheet field-effect transistor formed on a first portion of a substrate, the first nanosheet field-effect transistor formed on the first portion of a substrate includes a first source drain epitaxy, wherein a top surface of the first source drain epitaxy is above a top surface of a top-most nanosheet channel layer;
a second nanosheet field-effect transistors formed on a second portion of the substrate, the second nanosheet field-effect transistor formed on the second portion of the substrate includes a second source drain epitaxy and a third source drain epitaxy, wherein a top surface of the third source drain epitaxy is above the top surface of the top-most nanosheet channel layer; and
an etch stop liner around the first source drain epitaxy, the etch stop liner separates the first source drain epitaxy from an interlayer dielectric,
wherein the third source drain epitaxy is directly connected to at least the top-most nanosheet channel layer.

10. The semiconductor structure of claim 9, further comprising:
an isolation layer separating the substrate from the first source drain epitaxy and the second source drain epitaxy; and
a shallow trench isolation separating the first nanosheet field-effect transistor formed on the first portion of the substrate from the second nanosheet field-effect transistor formed on the second portion of the substrate.

11. The semiconductor structure of claim 9, wherein the first source drain epitaxy is made of phosphorous doped silicon.

12. The semiconductor structure of claim 9, wherein the second source drain epitaxy is made of boron doped silicon.

13. The semiconductor structure of claim 9, wherein the third source drain epitaxy is made of pure germanium or silicon germanium doped with a high germanium percentage.

14. The semiconductor structure of claim 9, wherein the first nanosheet field-effect transistor is a p-type nanosheet field-effect transistor and the second nanosheet field-effect transistor is a n-type nanosheet field-effect transistor or wherein the first nanosheet field-effect transistor is a n-type nanosheet field-effect transistor and the second nanosheet field-effect transistor is a p-type nanosheet field-effect transistors.

* * * * *